United States Patent
Onizuka et al.

(10) Patent No.: US 9,124,216 B2
(45) Date of Patent: Sep. 1, 2015

(54) POWER AMPLIFIER AND TRANSMITTER

(71) Applicant: KABUSHIKI KAISHA TOSHIBA, Minato-ku (JP)

(72) Inventors: Kohei Onizuka, Shinagawa (JP); Shigehito Saigusa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/619,504

(22) Filed: Feb. 11, 2015

(65) Prior Publication Data

US 2015/0155832 A1 Jun. 4, 2015

Related U.S. Application Data

(63) Continuation of application No. PCT/JP2013/071991, filed on Aug. 9, 2013.

(30) Foreign Application Priority Data

Aug. 13, 2012 (JP) ................................. 2012-179485

(51) Int. Cl.
*H03F 1/02* (2006.01)
*H03F 3/19* (2006.01)
(Continued)

(52) U.S. Cl.
CPC ................ *H03F 1/0216* (2013.01); *H03F 3/19* (2013.01); *H03F 3/217* (2013.01); *H04L 25/03* (2013.01); *H03F 2200/102* (2013.01); *H03F 2200/421* (2013.01); *H03F 2200/451* (2013.01)

(58) Field of Classification Search
CPC ....... H03F 3/345; H03F 3/211; H03F 1/0216; H03F 2200/429; H03F 2200/507; H03F 3/005; H03F 3/193; H03F 3/265

See application file for complete search history.

(56) References Cited

U.S. PATENT DOCUMENTS

| 6,204,731 B1 | 3/2001 | Jiang et al. |
| 7,768,350 B2 | 8/2010 | Srinivasan et al. |

(Continued)

FOREIGN PATENT DOCUMENTS

| JP | 2002-158551 A | 5/2002 |
| JP | 2011-114459 A | 6/2011 |
| WO | WO 2008/075561 A1 | 6/2008 |

OTHER PUBLICATIONS

International Search Report issued Sep. 24, 2013, for PCT/JP2013/071991 filed on Aug. 9, 2013 in English.

(Continued)

*Primary Examiner* — Curtis Odom
(74) *Attorney, Agent, or Firm* — Oblon, McClelland, Maier & Neustadt, L.L.P.

(57) ABSTRACT

A power amplifier includes a first amplifier unit, a second amplifier unit, a first switching element, a second switching element and a third switching element. Each of the amplifier units includes a power supply terminal, a ground terminal, an input terminal, and an output terminal, and amplifies a signal received at the input terminal according to a voltage between the power supply terminal and the ground terminal, and outputs the signal from the output terminal. The first switching element is connected between the ground terminal of the first amplifier unit and the power supply terminal of the second amplifier unit. The second switching element is connected between the ground terminal of the first amplifier unit and a first reference voltage terminal. The third switching element is connected between the power supply terminal of the second amplifier unit and a second reference voltage terminal.

14 Claims, 16 Drawing Sheets

(51) Int. Cl.
*H03F 3/217* (2006.01)
*H04L 25/03* (2006.01)

(56) References Cited

U.S. PATENT DOCUMENTS

2007/0086791 A1* 4/2007 Noya et al. .................. 398/202
2008/0164941 A1 7/2008 Lee et al.
2010/0079210 A1 4/2010 Yamauchi et al.
2012/0146731 A1* 6/2012 Khesbak ...................... 330/295

OTHER PUBLICATIONS

Walling, Jeffrey S. et al., "A Class-G Supply Modulator and Class-E PA in 130 nm CMOS," *IEEE Journal of Solid-State Circuits*, vol. 44, No. 9, pp. 2339-2347, Sep. 2009.
Office Action issued Sep. 19, 2014 in Japanese Patent Application No. 2012-179485 (with English language translation).

* cited by examiner

POWER AMPLIFIER AND TRANSMITTER

CROSS REFERENCE TO RELATED APPLICATIONS

This application is a Continuation of International Application No. PCT/JP2013/071991, filed on Aug. 9, 2013, the entire contents of which is hereby incorporated by reference, the International Application No. PCT/JP2013/071991 claiming the benefit of priority from the prior Japanese Patent Application No. 2012-179485, filed on Aug. 13, 2012.

FIELD

Embodiments described herein relate to a power amplifier and a transmitter.

BACKGROUND

Conventional linear RF (radio frequency) power amplifiers have a problem in that drain efficiency is uniquely reduced when output power is reduced (backed off). To solve the problem, techniques for improving the efficiency at back-off, such as a polar transmitter, EER (envelope elimination and restoration), and ET (envelope tracking), have been developed. In the above techniques, however, when a series variable resistive circuit such as a linear regulator is used in modulating a voltage at a drain (power supply) terminal of the RF power amplifier according to an envelope, the efficiency at back-off is eventually uniquely reduced.

In a conventional method, different power supply voltages are respectively supplied to envelope amplifiers M1 and M2. When the envelope has a small amplitude, the envelope amplifier to which a lower power supply voltage is supplied is used to improve the efficiency. When the envelope has a large amplitude, the envelope amplifier to which a higher power supply voltage is supplied is used to ensure linearity (a class-G modulator).

In the conventional method, however, it is necessary to supply two or more different types of power supply voltages. It is difficult to supply a plurality of power supply voltages from outside in terminal applications with restrictions on costs and mounting areas.

It is also not realistic to generate different power supply voltages from one type of power supply voltage by using a DC-DC converter or the like provided within the amplifier from the viewpoint of mounting areas, costs, and efficiency.

DETAILED DESCRIPTION

According to some embodiments, a power amplifier includes: at least two amplifier units including a first amplifier unit and a second amplifier unit, a first switching element, a second switching element and a third switching element.

Each of the amplifier units includes a power supply terminal, a ground terminal, an input terminal, and an output terminal, and amplifies a signal received at the input terminal according to a voltage between the power supply terminal and the ground terminal, and outputs the signal from the output terminal.

The first switching element is connected between the ground terminal of the first amplifier unit and the power supply terminal of the second amplifier unit.

The second switching element is connected between the ground terminal of the first amplifier unit and a first reference voltage terminal.

The third switching element is connected between the power supply terminal of the second amplifier unit and a second reference voltage terminal.

In the following, embodiments will be described in detail by reference to the drawings.

First Embodiment

Figure 1:
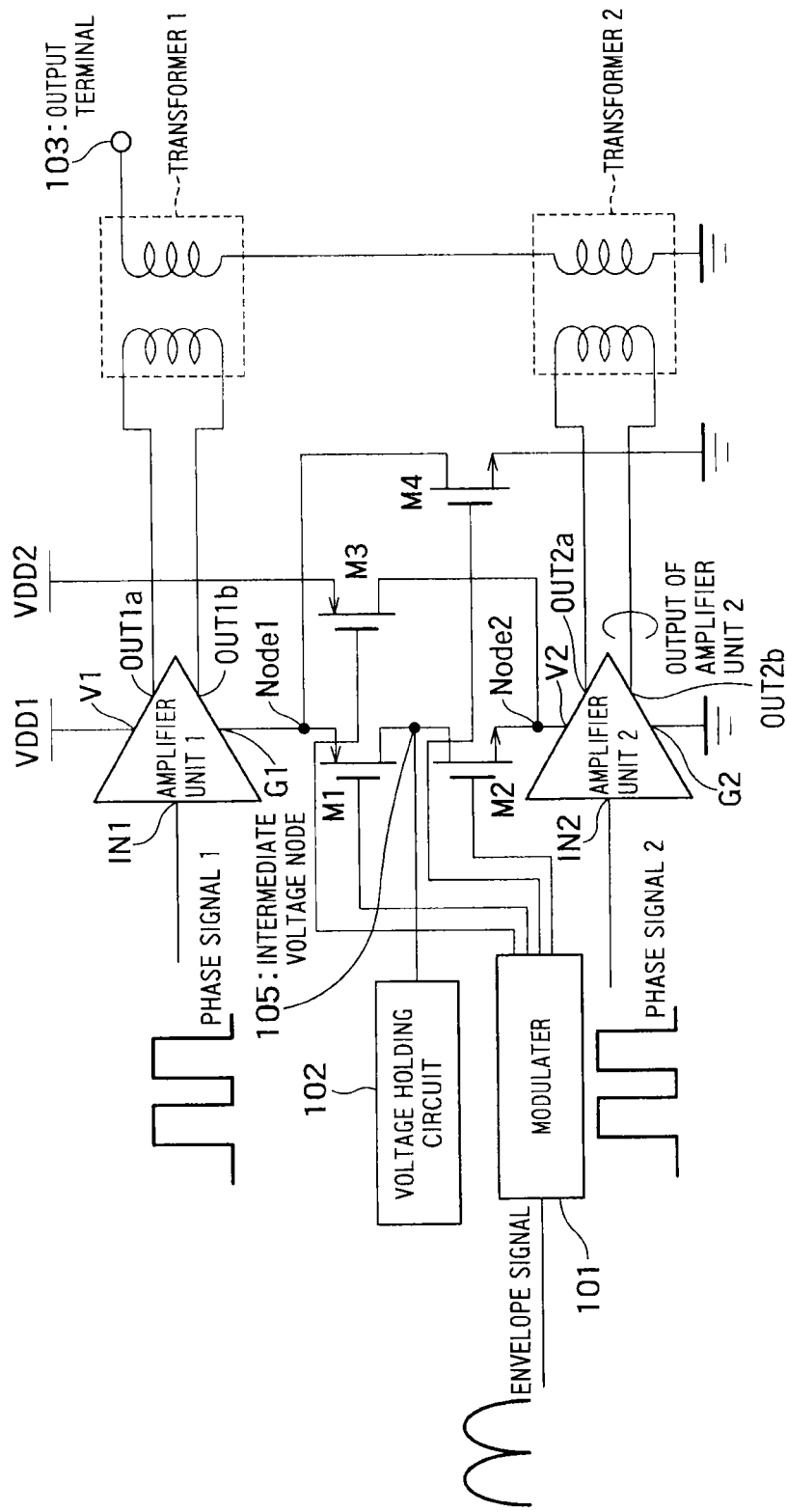
FIG. 1 is a block diagram of a power amplifier according to a first embodiment.

FIG. 1 is a block diagram showing a power amplifier according to a present embodiment.

The power amplifier includes two or more amplifier units: first to "N"-th ("N" is an integer of two or more) amplifier units. The power amplifier improves power efficiency and linearity when the amplifier units are operated in parallel. Although a case in which the number of amplifier units is two will be described in the present embodiment, the number may be also three or more. One of the first to "N"-th amplifier units may be referred to as "X"-th ("X" is an integer of one to "N") amplifier unit.

An amplifier unit 1 and an amplifier unit 2 are shown as the two amplifier units. The amplifier unit 1 includes an input terminal IN1, output terminals OUT1a and OUT1b, a power supply terminal V1, and a ground terminal G1. The amplifier unit 1 amplifies a signal received at the input terminal IN1 according to a voltage between the power supply terminal V1 and the ground terminal G1, and outputs the signal from the output terminals OUT1a and OUT1b. The amplifier unit 2 includes an input terminal IN2, output terminals OUT2a and OUT2b, a power supply terminal V2, and a ground terminal G2. The amplifier unit 2 amplifies a signal received at the input terminal IN2 according to a voltage between the power supply terminal V2 and the ground terminal G2, and outputs the signal from the output terminals OUT2a and OUT2b.

Both the amplifier unit 1 and the amplifier unit 2 are RF amplifiers. Outputs from the respective amplifier units are subjected to power synthesis and impedance transformation by a transformer 1 and a transformer 2. A signal obtained by the power synthesis and the impedance transformation is output from an output terminal as an amplified signal by the present power amplifier.

A node Node1 is directly connected to the ground terminal G1 of the amplifier unit 1. A node Node2 is directly connected to the power supply terminal V2 of the amplifier unit 2. A transistor M1 (a first switching element), a transistor M2 (a fourth switching element), a transistor M3 (a third switching element), and a transistor M4 (a second switching element) are provided as switching elements. The transistors are respectively used to set voltages at the Node1 and the Node2. The transistors M1 and M3 are, for example, NMOS (N-channel metal oxide semiconductor) transistors, and the transistors M2 and M4 are, for example, PMOS (P-channel metal oxide semiconductor) transistors.

A first terminal of the transistor M1 is electrically connected to the ground terminal G1 of the amplifier unit 1. A second terminal of the transistor M1 is electrically connected to a third terminal of the transistor M2. A fourth terminal of the transistor M2 is electrically connected to the power supply terminal V2 of the amplifier unit 2. A connection node between the transistors M1 and M2 is referred to as intermediate voltage node 105. For example, a voltage at the intermediate voltage node 105 is preferably ½ of a power supply voltage VDD1. When the number of amplifier units is three or more, an intermediate node voltage between an "X"-th amplifier unit and an "X"+1-th amplifier unit is preferably (N−X)/N of the power supply voltage VDD1. It is assumed that an amplifier unit having a smaller "X" value is closer to the VDD1 side.

An envelope signal of a radio frequency signal is input to a modulator (a control circuit) 101. The modulator 101 controls the transistors M1, M2, M3, and M4 based on an amplitude of the envelope signal.

In the following, a case in which the present configuration is used as a component of a polar transmitter or EER (envelope elimination and restoration) will be described first. In the usage, phase signals of RF signal wave are input to the input terminals IN1 and IN2 of the amplifier units 1 and 2. Voltage signals controlled according to (for example, made proportional to) the envelope signal are also input to the power supply terminals V1 and V2 of the amplifier units 1 and 2.

In the configuration, the amplifier units 1 and 2 are operated in saturation so as to ensure linearity between a power supply voltage and an output power. The amplifier units 1 and 2 respectively generate RF signals modulated (amplified) by multiplying together the phase signals input to the input terminals IN1 and IN2 and the voltage signals input to the power supply terminals V1 and V2.

Figure 2:
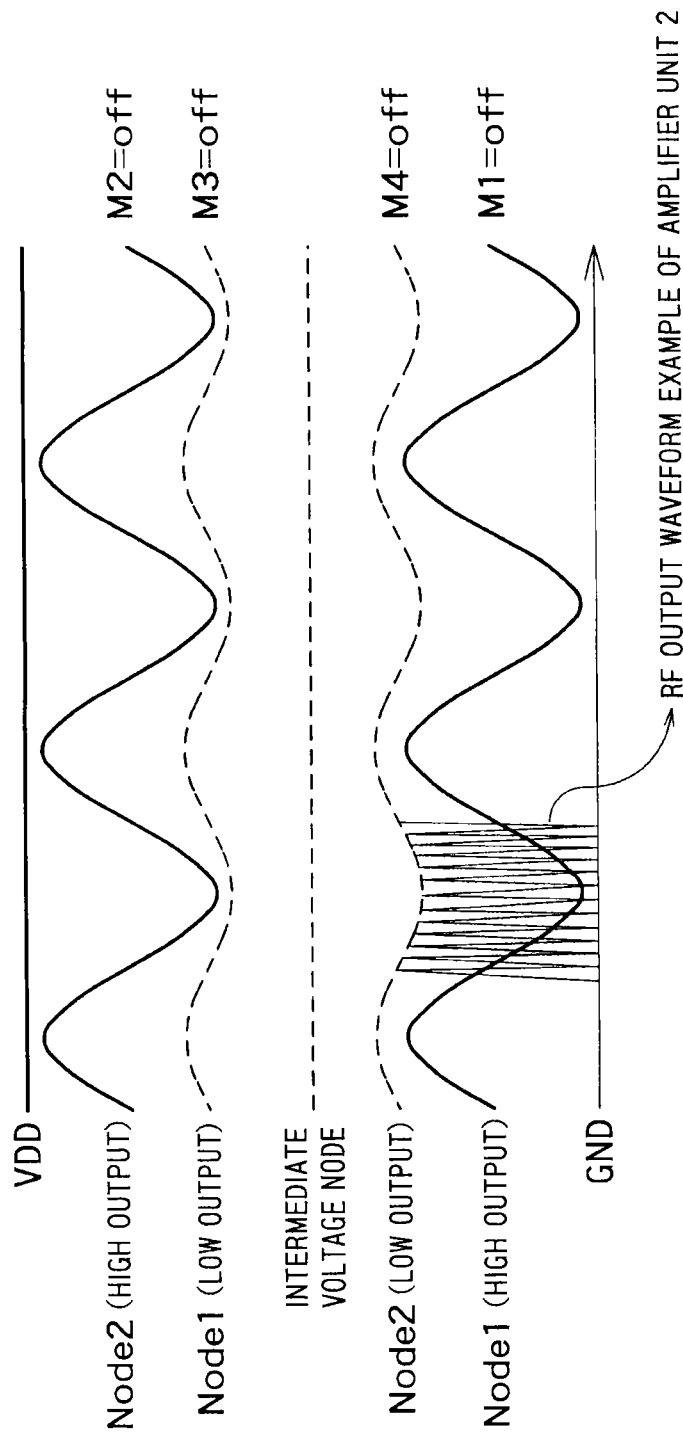
FIG. 2 is a view showing a voltage waveform example of a main node according to the first embodiment.

FIG. 2 shows one voltage waveform example of the Node1 and the Node2.

When output powers from the amplifier units 1 and 2 are within a small region, that is, a voltage of the envelope signal is less than a predetermined value, the transistors M3 and M4 are turned OFF, and the transistors M1 and M2 operate as variable resistors. The Node1 and the Node2 are thereby controlled to track (for example, be proportional to) an envelope. That is, the modulator 101 controls gate terminals of the transistors M1 to M4 based on the input envelope signal so as to achieve the above operation. The RF signals obtained by modulating the envelope signal are thereby respectively output from the amplifier units 1 and 2. When the voltage of the envelope signal is less than the predetermined value, a voltage less than a transistor threshold value (a voltage of low level) is applied to the gate terminals of the transistors M3 and M4. Meanwhile, a voltage is applied to the gate terminals of the transistors M1 and M2 such that the RF signals proportional to the voltage of the envelope signal are output from the amplifier units 1 and 2. In a simple configuration, the voltage of the envelope signal may be directly applied to the gate terminals of the transistors M1 and M2.

When the output powers from the amplifier units 1 and 2 are within a large region, that is, the voltage of the envelope signal is equal to or more than the predetermined value, the transistors M1 and M2 are turned OFF, and the transistors M3 and M4 operate as variable resistors. The Node1 and the Node2 thereby track the envelope. That is, the modulator 101 controls the gate terminals of the transistors M1 to M4 based on the input envelope signal so as to achieve the above operation. The RF signals obtained by modulating the envelope signal are thereby respectively output from the amplifier units. For example, when the voltage of the envelope signal is equal to or more than the predetermined value, a voltage less than the transistor threshold value is applied to the gate terminals of the transistors M1 and M2. Meanwhile, a voltage is applied to the gate terminals of the transistors M3 and M4 such that the RF signals proportional to the voltage of the envelope signal are output from the amplifier units 1 and 2. In a simple configuration, the voltage of the envelope signal may be directly applied to the gate terminals of the transistors M3 and M4.

At the time of low output power described above, the power supplies of the two amplifier units 1 and 2 are connected in series between the power supply voltage VDD1 and a ground (a first reference voltage terminal). Accordingly, a power supply current from the VDD1 is applied to the amplifier unit 1, and reused in the amplifier unit 2. Power efficiency can be thereby improved while a maximum output power is restricted.

If power supply voltage/current characteristics of the amplifier units 1 and 2 are completely the same as each other, the intermediate voltage node 105 is accurately set to half the voltage VDD1. In the present embodiment, voltage accuracy can be further increased by adding an intermediate voltage holding circuit 102. A smoothing capacitor, a linear regulator or the like can be used as the intermediate voltage holding circuit 102.

The voltage VDD1 and a voltage VDD2 (a second reference voltage terminal) are preferably set to be equal to each other. In this state, the present amplifying circuit can be operated only by applying a single power supply voltage to the entire amplifier. In the case of the single power supply voltage, a circuit area can be made smaller, and costs can be reduced.

Figure 3:
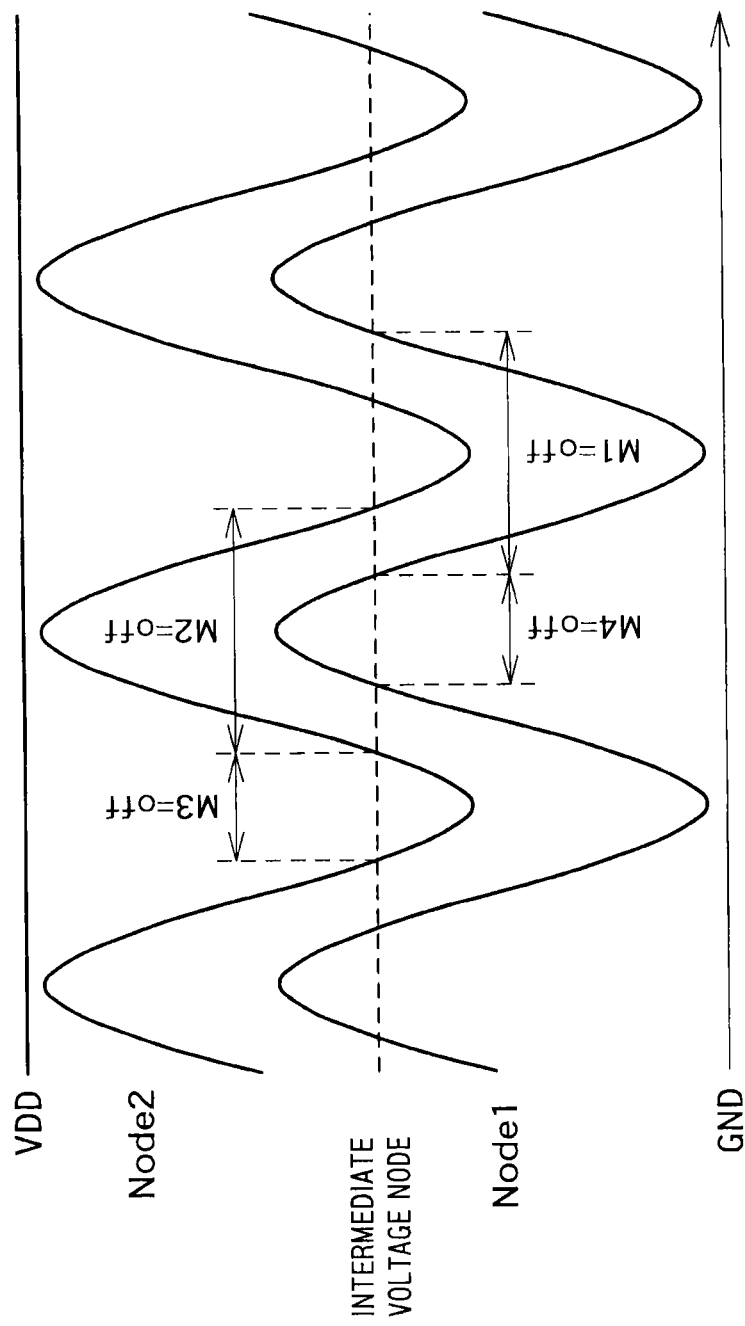
FIG. 3 is a view showing another voltage waveform example of the main node according to the first embodiment.

FIG. 3 shows a waveform example in a case in which the envelope has a larger amplitude than that in FIG. 2.

In this case, the transistors M1 to M4 are dynamically switched/modulated according to the amplitude of the envelope. The amplifier configuration is thereby reconfigured in real time. When the voltage at the Node1 is equal to or more than the intermediate voltage, the transistor M4 is turned OFF, and the transistor M1 is turned ON. When the voltage at the Node1 is less than the intermediate voltage, the transistor M4 is turned ON, and the transistor M1 is turned OFF. When the voltage at the Node2 is equal to or more than the intermediate voltage, the transistor M3 is turned OFF, and the transistor M2 is turned ON. When the voltage at the Node2 is less than the intermediate voltage, the transistor M3 is turned ON, and the transistor M2 is turned OFF.

Next, a case in which the present configuration is used as a component of an ET (envelope tracking) amplifier will be described. Linear amplifiers are basically used as the amplifier units 1 and 2 in the ET amplifier.

In the linear amplifiers, RF signals in which envelope components remain are input to the amplifier units 1 and 2 instead of the phase signals 1 and 2. The modulator 101 then controls the gate terminals of the transistors M1 to M4 based on the input envelope signal. The voltages at the Node1 and the Node2 are thereby controlled to respectively track the envelope signal in a slightly lower state and a slightly higher state. To be more precise, the voltages are controlled to track the envelope in a slightly lower state and a slightly higher state than a value normalized by the power supply voltage.

Alternatively, a certain threshold value may be provided. When the amplitude of the envelope signal is higher than the threshold value, the transistors M1 and M2 may be turned OFF, and the transistors M3 and M4 may be turned ON. When the amplitude is equal to or lower than the threshold value, the transistors M1 and M2 may be turned ON, and the transistors M3 and M4 may be turned OFF.

As described above, the efficiency at back-off can be also improved even when the present configuration is used as the ET amplifier.

Figure 4:
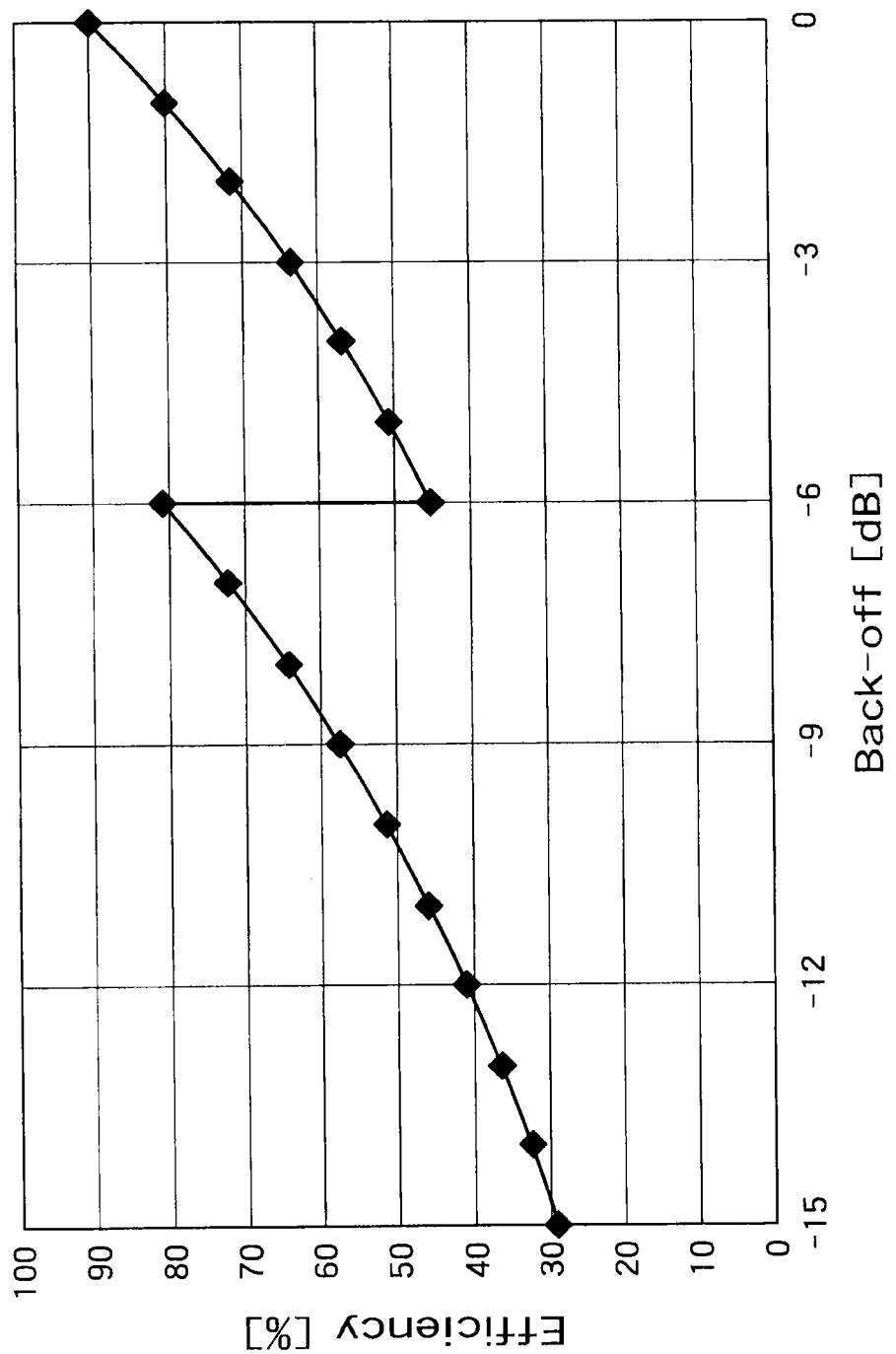
FIG. 4 is a graph showing an example of calculating characteristics of efficiency at back-off according to the first embodiment.

FIG. 4 shows an example of calculating theoretical power efficiency (characteristics of entire drain efficiency or efficiency at back-off) when the configuration in FIG. 1 is used.

A value obtained in a case of back-off=0 dB is a peak output power. When the amount of back-off increases, each amplifier unit consumes more power, and the power efficiency is deteriorated. However, the power efficiency is improved by turning OFF the transistors M3 and M4, and turning ON the transistors M1 and M2 when the output power is backed off by 6 dB to ¼. That is, the efficiency is improved to a level close to that of the peak almost without changing gain of the power amplifier.

As described above, although the number of amplifier units is two in the configuration in FIG. 1, the number may be three or more.

A method other than the transformer may be also used as the output power synthesis method. For example, a power synthesis method using a capacitor by means other than magnetic field coupling may be used.

To further reduce the output power from that of the aforementioned operating state, the amplifier unit 1 or 2 may be completely turned OFF by completely turning OFF the transistors M1 and M4, or M2 and M3. Accordingly, the power consumption can be reduced, and the power efficiency can be further improved.

Although the number of switches connected in series between the amplifier unit 1 and the amplifier unit 2 is two in the configuration in FIG. 1, the number may be also one. In this case, the number of switches is reduced by one, and the voltage holding circuit becomes unnecessary. The circuit area can be thereby made smaller. When the number of switches is two, there is an advantage in that the voltages applied to the amplifier units 1 and 2 can be compensated by the voltage holding circuit while the circuit area becomes larger than that of when the number of switches is one.

Second Embodiment

Figure 5:
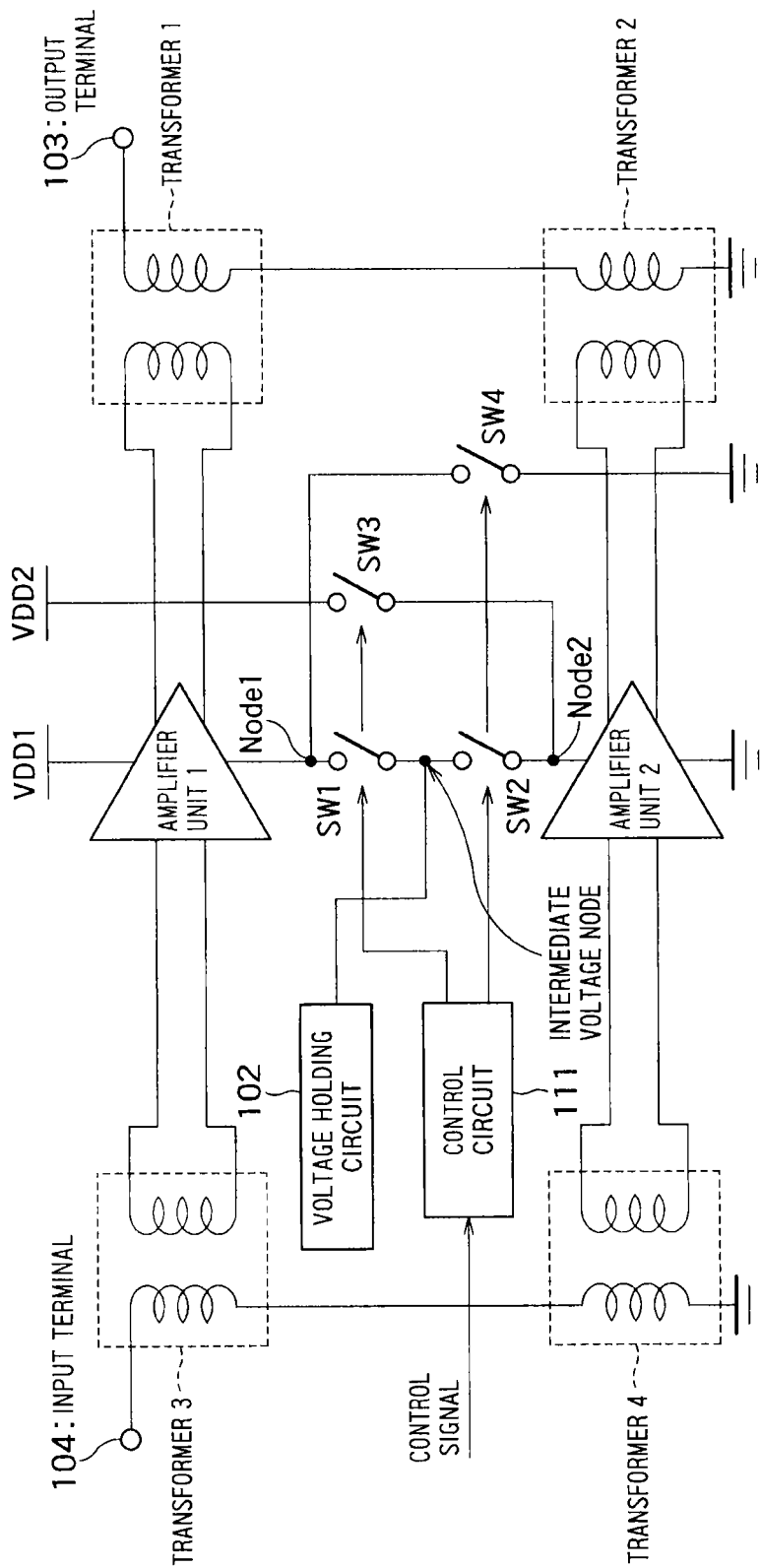
FIG. 5 is a block diagram of a power amplifier according to a second embodiment.

FIG. 5 is a block diagram of a power amplifier according to a second embodiment of the present invention.

In the present embodiment, switches SW1 to SW4 are provided as the switching elements. While the switching elements (the transistors) in the configuration in FIG. 1 operate as the variable resistors, the switches SW1 to SW4 in the present embodiment assume either ON or OFF state.

In the present configuration, it is also controlled such that the switches SW1 and SW2 are turned ON, and the switches SW3 and SW4 are turned OFF at the time of low output power, and the switches SW3 and SW4 are turned ON, and the switches SW1 and SW2 are turned OFF at the time of high output power. The control is performed by a control circuit 111 based on a control signal originating from external.

When the present configuration is assumed to be used in a terminal of a mobile phone system, the control signal may be a transmission power control signal from a base station. The transmission power control signal is a signal that, for example, identifies the low output power or the high output power. The control signal may be a control signal from a transceiver IC (integrated circuit) inside the terminal, or may be other signals.

An RF signal is input to an input terminal 104. The input RF signal is divided to the amplifier units 1 and 2 through a transformer 3 and a transformer 4. In the configuration, common levels of the input signals to the amplifier units 1 and 2 can be separated, and the respective levels can be independently set.

Figure 6:
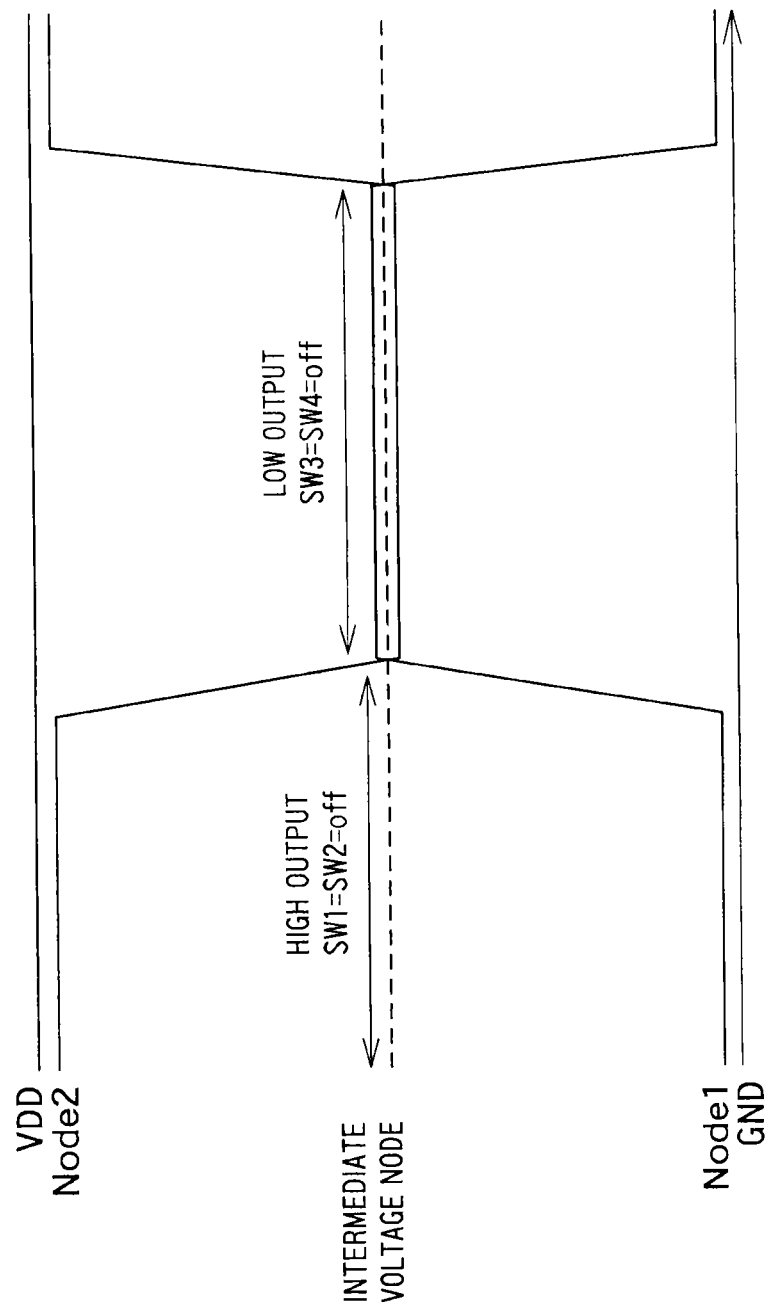
FIG. 6 is a view showing a voltage waveform example of a main node according to the second embodiment.
Figure 7:
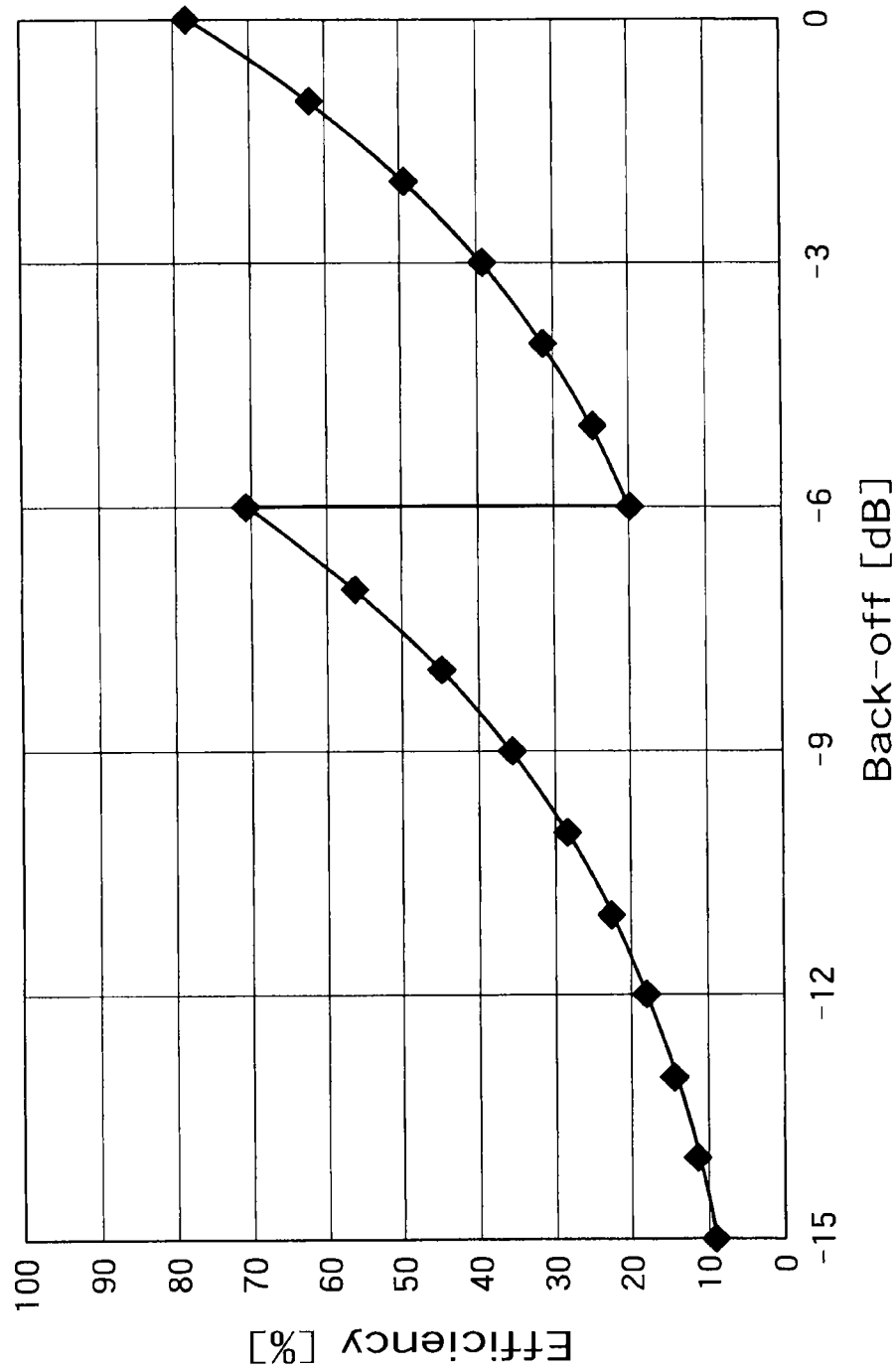
FIG. 7 is a graph showing an example of calculating characteristics of efficiency at back-off according to the second embodiment.

FIG. 6 shows a voltage waveform example of a main node in the configuration in FIG. 5. FIG. 7 shows an example of calculating characteristics of efficiency at back-off in the configuration in FIG. 5.

In the present embodiment, linear amplifiers are assumed to be used as the amplifier units 1 and 2. Thus, peak efficiency is lower than that in the embodiment shown in FIG. 4. However, the efficiency can be improved almost without changing gain of the power amplifier by switching the switches as described above when the output power is backed off by 6 dB.

In view of power efficiency, ON resistance of the switches SW1 to SW4 is preferably as low as possible. The amplifier units 1 and 2 may not necessarily be the linear amplifiers. The switches may not be accurately switched at the 6 dB back-off point.

Although the two switches SW1 and SW2 are connected in series between the amplifier units 1 and 2 in FIG. 5, the above operation can be achieved even when the number of switches is one similarly to the first embodiment.

Third Embodiment

Figure 8:
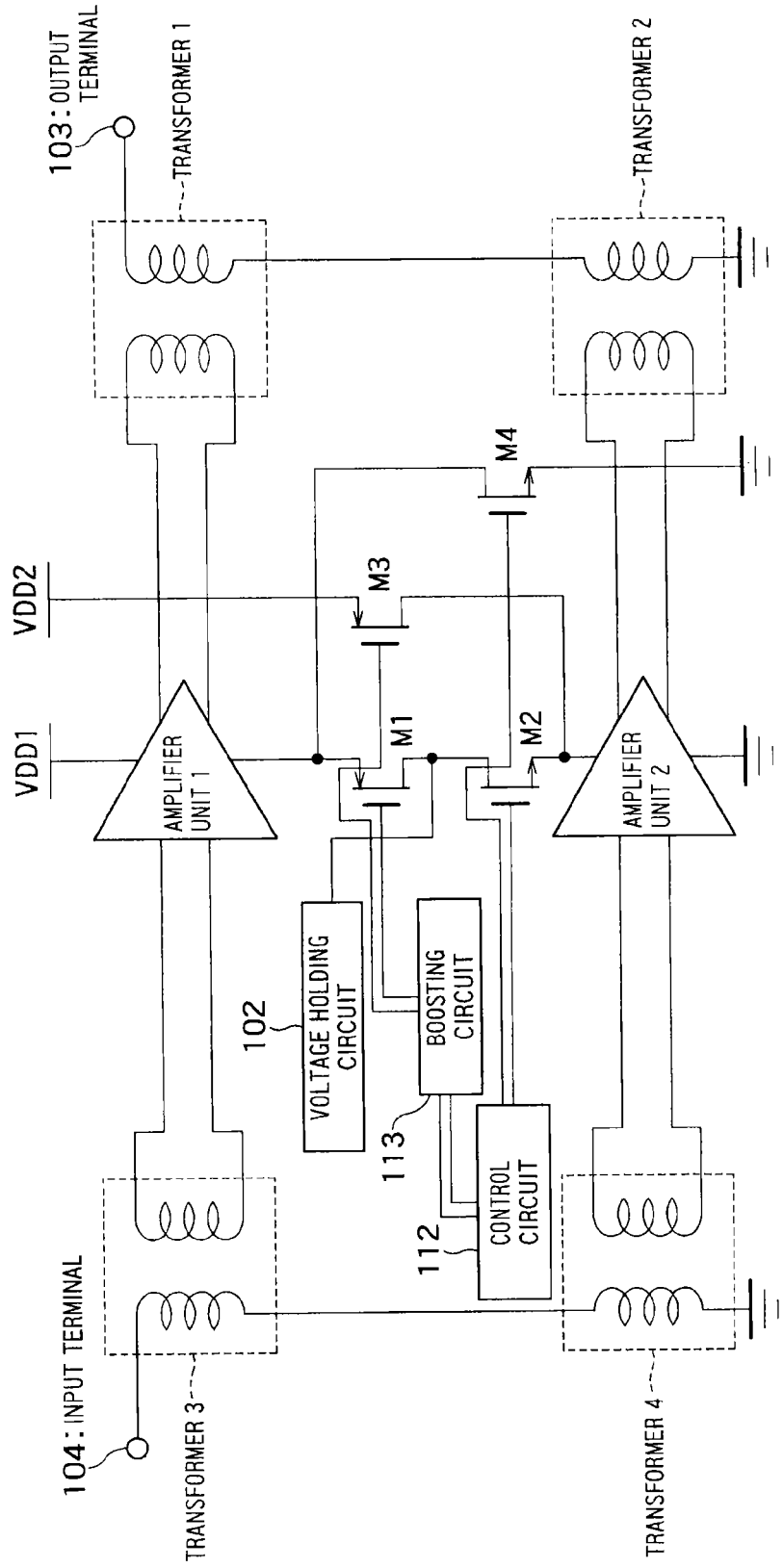
FIG. 8 is a block diagram of a power amplifier according to a third embodiment.

FIG. 8 is a block diagram of a power amplifier according to a third embodiment of the present invention.

In the present embodiment, NMOS transistors M1 and M3 are arranged instead of the switches SW1 and SW3 in the second embodiment, and PMOS transistors M2 and M4 are arranged instead of the switches SW2 and SW4.

Equivalent series resistance of each of the transistors M1 and M3 can be maintained lower as a gate voltage is set higher. A device size can be made smaller by increasing the gate voltage with respect to a certain resistance value.

Thus, in the present configuration, a boosting circuit 113 is provided on an output side of a control circuit 112. The boosting circuit 113 increases a voltage of a control signal output from the control circuit 112 and applies the signal to the transistor M1 or M3. To be more specific, the boosting circuit 113 outputs a signal of low logic level without boosting the signal, and boosts only a signal of high logic level. When the control signal is boosted as described above, a transistor size can be made smaller. Consequently, power efficiency and area efficiency can be improved.

As a modification, the control circuit 112 may directly output the signal of low logic level to the transistor without passing the signal through the boosting circuit 113, and output only the signal of high logic level to the boosting circuit 113.

Fourth Embodiment

Figure 9:
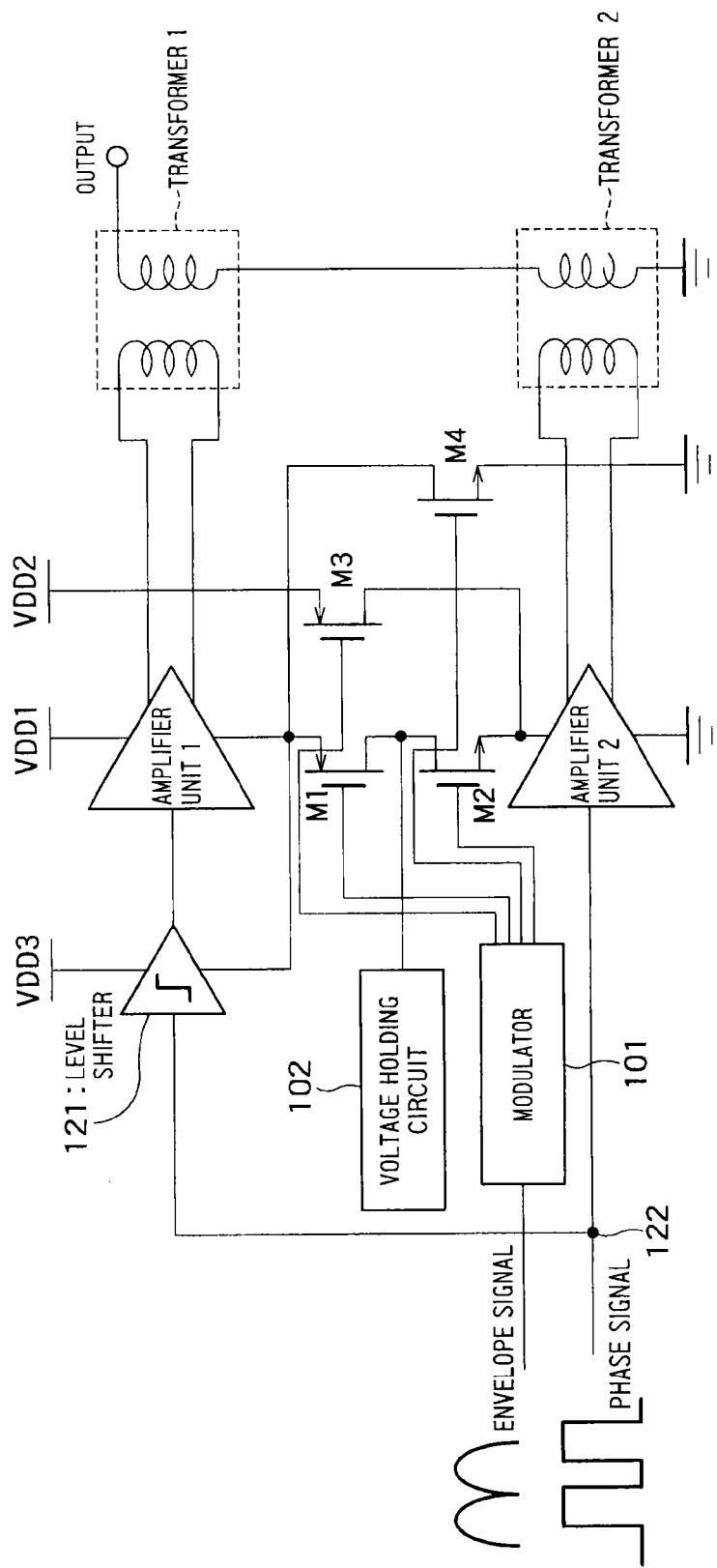
FIG. 9 is a block diagram of a power amplifier according to a fourth embodiment.

FIG. 9 is a block diagram of a power amplifier according to a fourth embodiment of the present invention.

Although the phase signals are respectively separately input to the amplifier units 1 and 2 in the first embodiment, one phase signal is input in the present embodiment. The input one phase signal is divided into two signals in a power dividing section 122. The divided phase signals are respectively input to the amplifier units 1 and 2. A level shifter 121 is inserted upstream of the amplifier unit 1. The other of the divided phase signals is input to the amplifier unit 1 through the level shifter 121. Accordingly, a DC level of the phase signal input to the amplifier unit 1 is adjusted. When the number of amplifier units is three or more, the input phase signal may be divided into three or more signals and distributed to the respective amplifier units. Level shifters are respectively arranged upstream of amplifier units other than the amplifier unit closest to the ground side to adjust DC levels.

Accordingly, operating points of the amplifier units 1 and 2 are respectively adjusted, and the signals with the same amplitude and phase are input to the amplifier units 1 and 2. Consequently, improvements in operating balances of the respective amplifier units, modulation accuracy of a modulated wave, and ACLR (adjacent channel leakage ratio), and a reduction in burden on the intermediate voltage holding circuit can be achieved.

Fifth Embodiment

Figure 10:
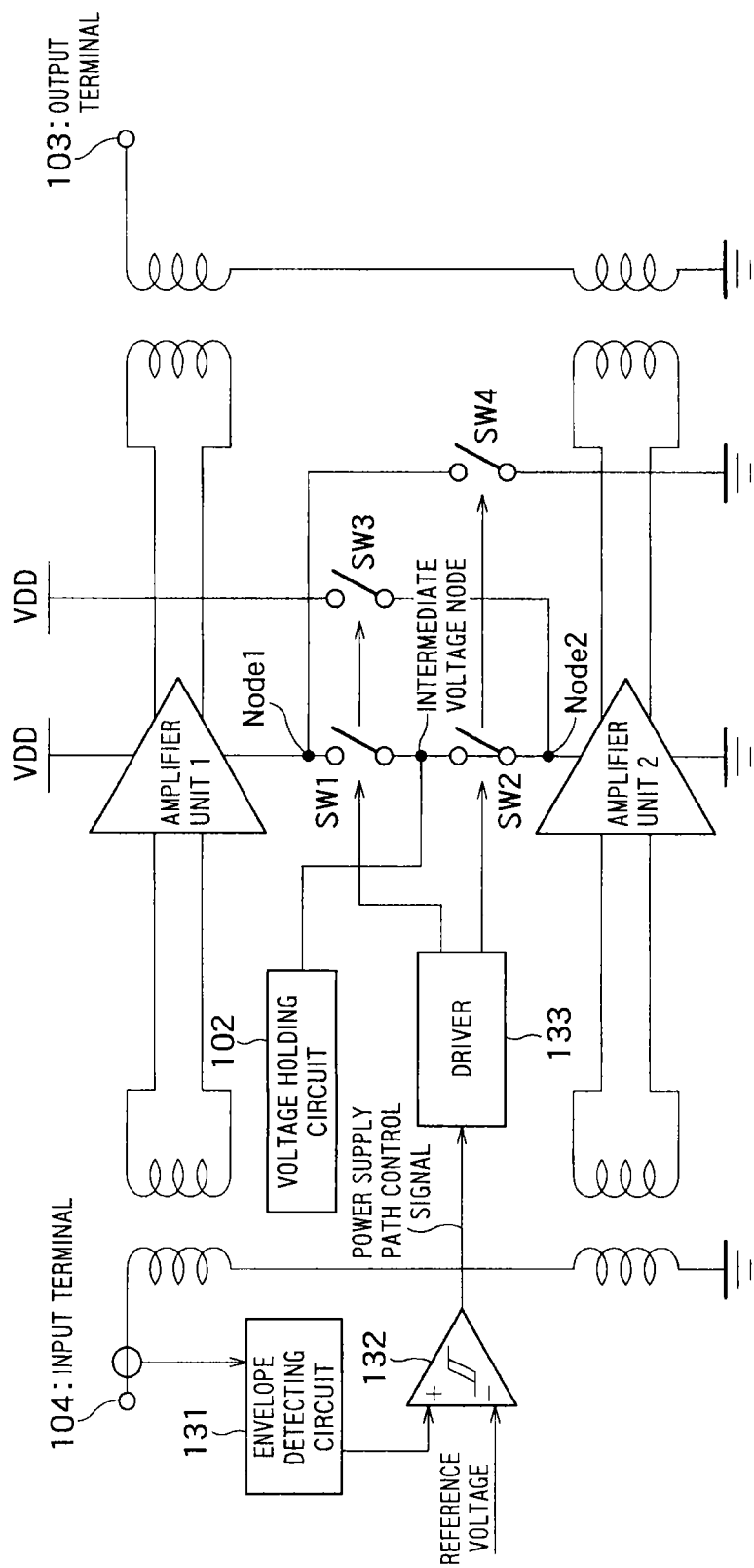
FIG. 10 is a block diagram of a power amplifier according to a fifth embodiment.

FIG. 10 is a block diagram of a power amplifier according to a fifth embodiment of the present invention.

In the present embodiment, an envelope detecting circuit 131 and a comparing circuit 132 are added.

The envelope detecting circuit 131 detects an envelope of an input signal.

A hysteresis comparator is provided as the comparing circuit 132. The comparing circuit 132 determines whether an amplitude of the envelope is higher or lower than a reference value (a reference voltage), and generates a binary power supply path control signal representing a determination result. The power supply path control signal is input to a driver circuit (a control circuit) 133. The driver circuit 133 drives the switches SW1 to SW4 based on the power supply path control signal.

Figure 11:
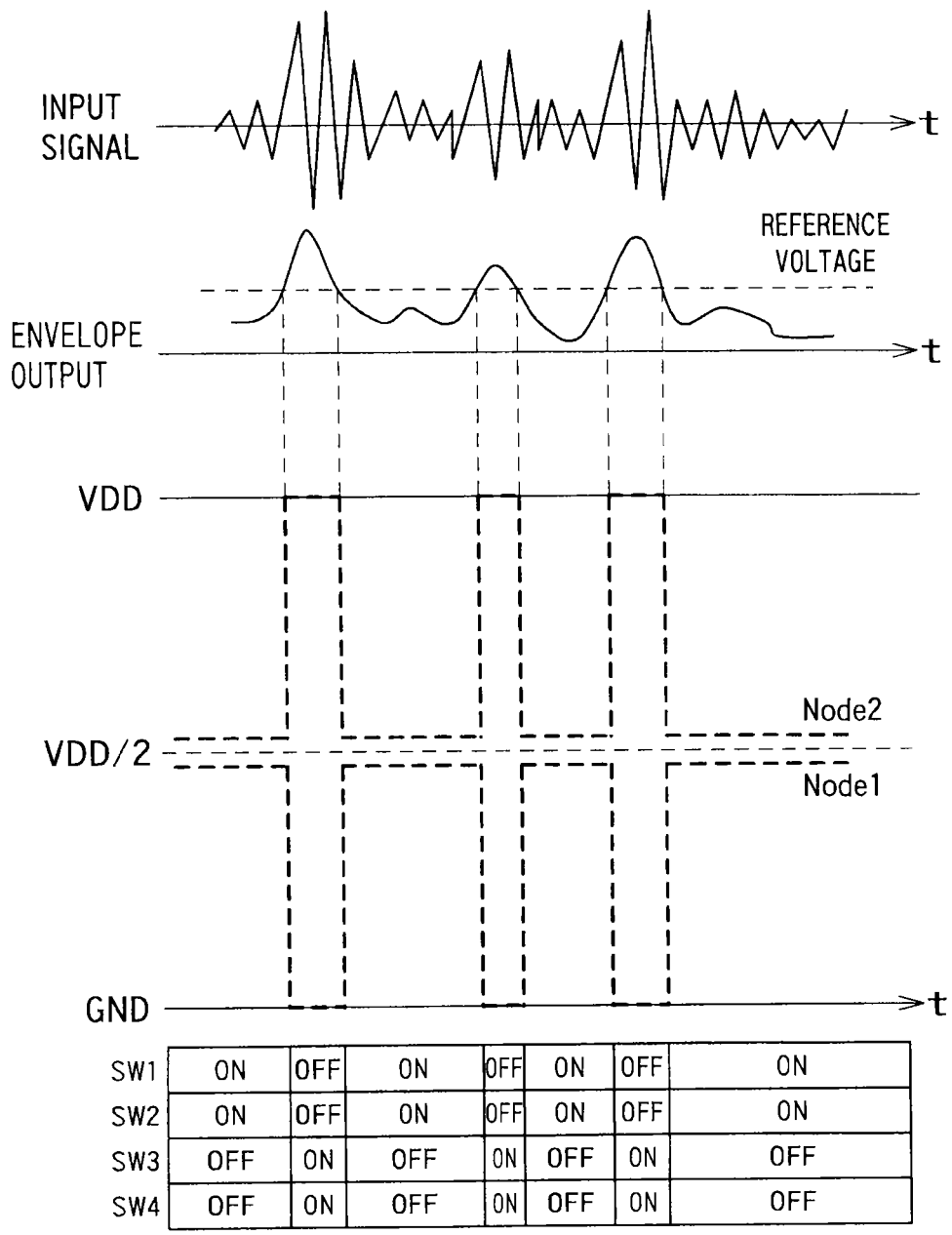
FIG. 11 is a view showing a voltage waveform example of a main node according to the fifth embodiment.

FIG. 11 is a schematic view showing an operating voltage waveform example of the input terminal, the envelope detecting circuit, the Node1, and the Node2. FIG. 11 also shows ON/OFF states of the switches SW1 to SW4.

The input signal received at the input terminal 104 is a signal (an RF signal) obtained by modulating a carrier signal.

When the envelope amplitude of the signal is lower than the threshold value (the reference voltage), the switches SW1 and SW2 are turned ON, and the switches SW3 and SW4 are turned OFF. Accordingly, an equivalent power supply voltage applied to each of the amplifier units 1 and 2 is decreased, and power efficiency of the power amplifier is maintained high.

Meanwhile, when the envelope amplitude is equal to or higher than the threshold value, the switches SW1 and SW2 are turned OFF, and the switches SW3 and SW4 are turned ON. Accordingly, the equivalent power supply voltage applied to each of the amplifier units is increased, and distortion in the power amplifier is maintained low.

Sixth Embodiment

Figure 12:
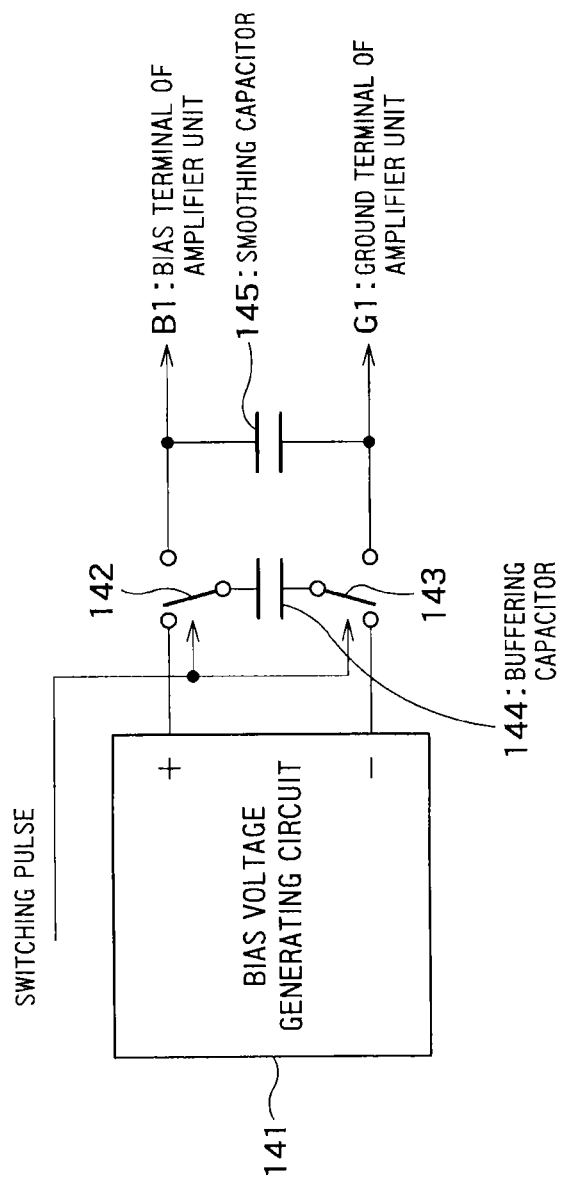
FIG. 12 is a diagram showing a bias stabilizing circuit according to a sixth embodiment.

FIG. 12 is a block diagram of a bias stabilizing circuit according to a sixth embodiment of the present invention.

In the aforementioned embodiments, while the ground terminal G2 of the amplifier unit 2 is fixed at the ground voltage (the first reference voltage), an absolute voltage value at the ground terminal G1 of the amplifier unit 1 changes. The present embodiment shows a configuration in which equal effective bias voltages are supplied to the amplifier units 1 and 2.

The present configuration includes a bias voltage generating circuit 141, a buffering capacitor 144, a voltage smoothing capacitor 145, and switches 142 and 143.

One end of the switch 142 and one end of the switch 143 are respectively connected to both terminals of the buffering capacitor 144. Terminals to which the other ends of the switches 142 and 143 are connected are periodically switched between output terminals (a plus terminal and a minus terminal) of the bias voltage generating circuit and both terminals of the voltage smoothing capacitor 145 according to a switching pulse. Both the terminals of the voltage smoothing capacitor 145 are connected to a bias terminal B1 of the amplifier unit 1 and the ground terminal G1 of the amplifier unit 1. When there are three or more amplifier units, the same configuration may be arranged in other amplifier units as well. The amplifier unit closest to the ground side may not be provided with the present configuration since the voltage at the ground terminal does not change.

With the above operation, an always constant effective bias voltage is applied even when the voltage at the ground terminal G1 of the amplifier unit 1 changes. The constant effective bias voltage is equal to an output voltage of the bias voltage generating circuit 141. As a result, gain, distortion, and output power characteristics of all the amplifier units used in the present power amplifier can be equalized. Consequently, lower distortion, higher efficiency, and higher output can be achieved for the entire power amplifier.

Seventh Embodiment

Figure 13:
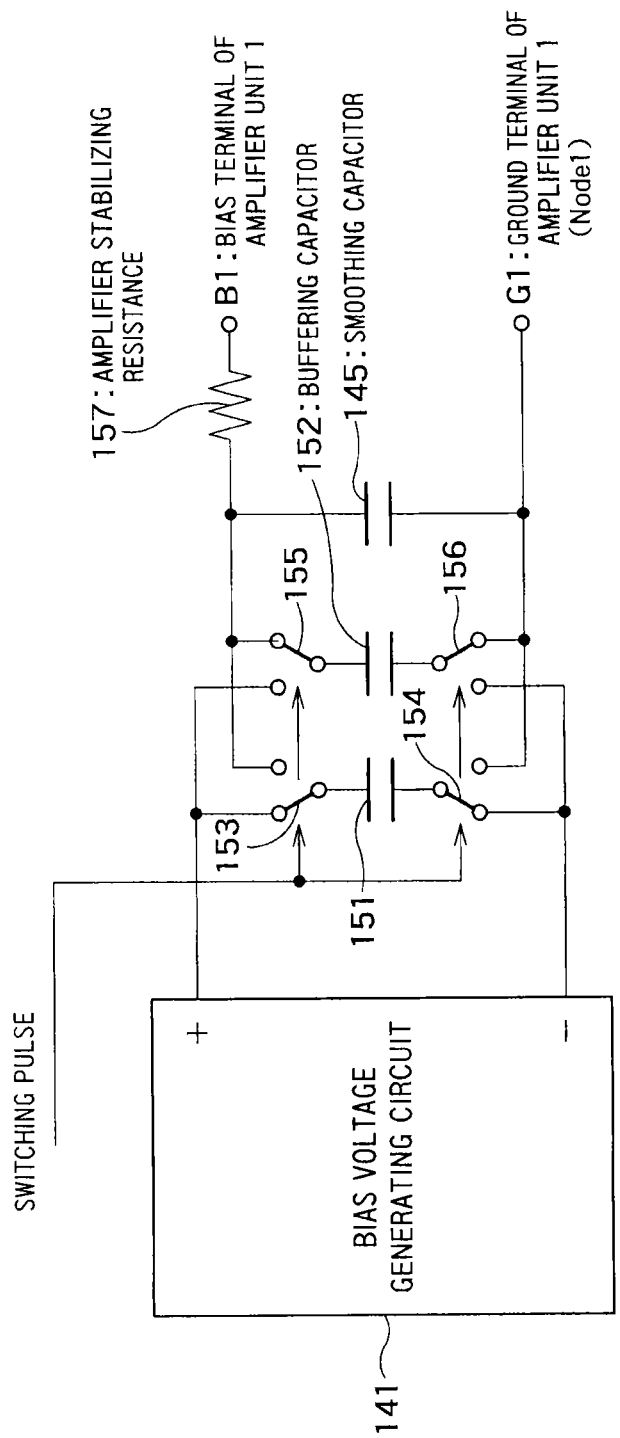
FIG. 13 is a diagram showing a bias stabilizing circuit according to a seventh embodiment.

FIG. 13 is a block diagram of a bias stabilizing circuit according to a seventh embodiment of the present invention.

In the present embodiment, two buffering capacitors (151, 152) are provided.

One end of a switch 153 and one end of a switch 154 are respectively connected to both terminals of the buffering capacitor 151. The other ends of the switches 153 and 154 can be switched between the output terminals (the plus terminal and the minus terminal) of the bias voltage generating circuit 141 and both the terminals of the smoothing capacitor 145.

One end of a switch 155 and one end of a switch 156 are respectively connected to both terminals of the buffering capacitor 152. The other ends of the switches 155 and 156 can be switched between the output terminals (the plus terminal and the minus terminal) of the bias voltage generating circuit 141 and both the terminals of the smoothing capacitor 145.

In the present configuration, while one of the buffering capacitors is being connected to the bias voltage generating circuit 141, the other of the buffering capacitors is connected to the amplifier unit 1.

That is, a first mode in which a bias voltage is applied with both the terminals of the buffering capacitor 151 being connected to the output terminals of the bias voltage generating circuit 141, and a second mode in which a bias voltage is applied with both the terminals of the buffering capacitor 152 being connected to the output terminals of the bias voltage generating circuit 141 are alternately switched. When the first mode is executed, both the terminals of the buffering capacitor 152 are connected to both the terminals of the smoothing capacitor 145 in parallel. When the second mode is executed, both the terminals of the buffering capacitor 151 are connected to both the terminals of the smoothing capacitor 145 in parallel.

The terminals to which the respective buffering capacitors 151 and 152 are connected are periodically switched according to a switching pulse applied originating from external. The two buffering capacitors are operated in a complementary manner as described above.

A difference between the output voltage of the bias voltage generating circuit 141 and the bias voltage applied to the amplifier unit 1 can be thereby reduced. As a result, gain, distortion, and output power characteristics of all the amplifier units used in the present power amplifier can be equalized. Consequently, lower distortion, higher efficiency, and higher output can be achieved for the entire power amplifier.

Eighth Embodiment

Figure 14:
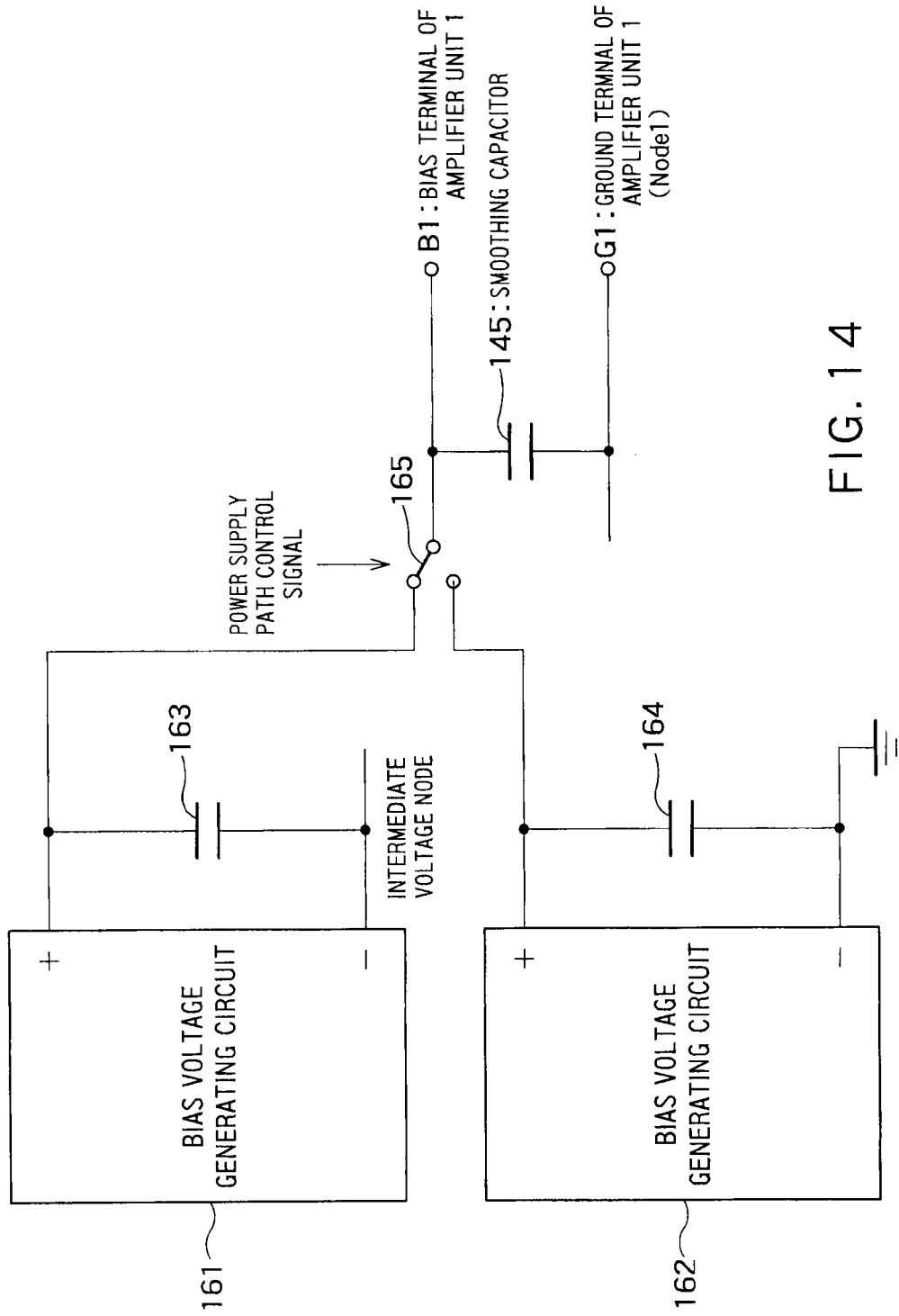
FIG. 14 is a diagram showing a bias stabilizing circuit according to an eighth embodiment.

FIG. 14 is a block diagram of a bias stabilizing circuit according to an eighth embodiment of the present invention.

In the present embodiment, two bias voltage generating circuits 161 and 162 are used.

A minus terminal of the bias voltage generating circuit 161 is connected to the intermediate voltage node of the amplifier unit 1. A minus terminal of the bias voltage generating circuit 162 is connected to the ground node.

One end of a switch 165 is connected to one end of the smoothing capacitor (the terminal connected to the bias terminal side of the amplifier unit 1). The other end of the switch 165 can be switched between plus terminals of the two bias voltage generating circuits.

The switch 165 is controlled based on the power supply path control signal (see FIG. 10) output from the comparing circuit. To be more specific, when the amplitude of the envelope is equal to or higher than the reference voltage, the switch 165 is connected to the plus terminal of the bias voltage generating circuit 162. When the amplitude of the envelope is lower than the reference voltage, the switch 165 is connected to the plus terminal of the bias voltage generating circuit 161.

Accordingly, voltage levels of the minus terminals of the respective bias voltage generating circuits are maintained at a predetermined value regardless of the operating state of the amplifier unit 1. Parasitic capacitances (not shown) of the minus terminals are not charged and discharged. Consequently, power consumption can be reduced, and voltage path control can be performed at higher speed.

Ninth Embodiment

Figure 15:
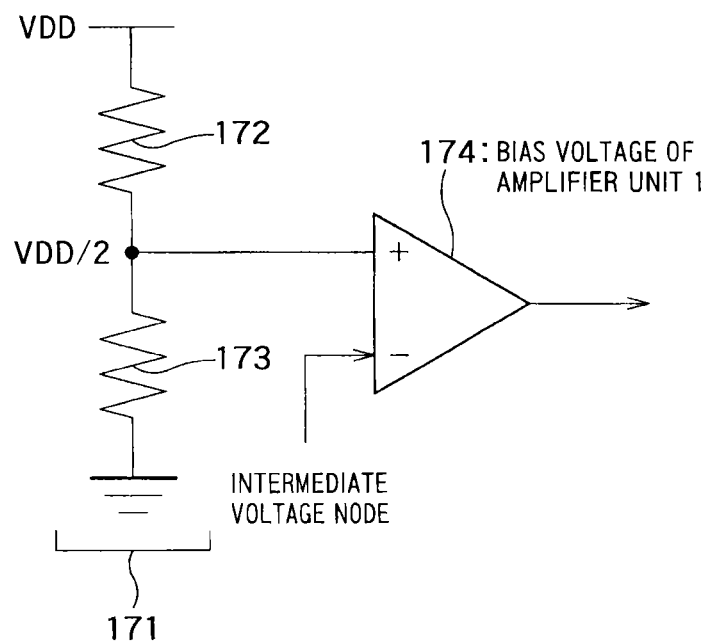
FIG. 15 shows a bias stabilizing circuit according to a ninth embodiment.

FIG. 15 is a block diagram of a bias stabilizing circuit according to a ninth embodiment of the present invention.

In the present embodiment, a power supply voltage VDD (a third reference voltage) is divided by a voltage dividing circuit 171 including an impedance element. Here, the power supply voltage VDD is halved by two resistance elements 172 and 173 connected in series between the VDD and the ground.

The VDD is connected to the power supply terminal of the amplifier unit 1. The divided voltage (VDD/2) is input to a plus terminal of a differential amplifier 174. The intermediate voltage node is connected to a minus terminal of the differential amplifier 174. An output of the differential amplifier 174 is input to the bias terminal of the amplifier unit 1. Accordingly, the bias voltage of the amplifier unit 1 is subjected to negative feedback such that the intermediate node voltage becomes equal to the divided voltage.

By performing the feedback as described above, voltage setting accuracy of the intermediate voltage node can be increased. Amplification characteristics of the respective amplifier units are thereby equalized, resultantly improving distortion, efficiency, output power characteristics or the like of the entire amplifier.

When there are three or more amplifier units, a voltage of (N−X)/N of the power supply voltage VDD is generated with respect to an "X"-th amplifier unit. That is, a divided voltage is generated according to the number of amplifier units "N" and the value of "X" (that is, the position of the "X"-th amplifier unit in a structure in which the amplifier units are connected in parallel). A differential between the divided voltage and a voltage of an intermediate voltage node between the "X"-th amplifier unit and an "X"+1-th amplifier unit is amplified by an "X"-th differential amplifier and input to a bias terminal of the "X"-th amplifier unit. The "X"-th differential amplifier is a differential amplifier arranged corresponding to the "X"-th amplifier unit. It is assumed that an amplifier unit having a smaller "X" value is closer to the VDD side.

Tenth Embodiment

Figure 16:
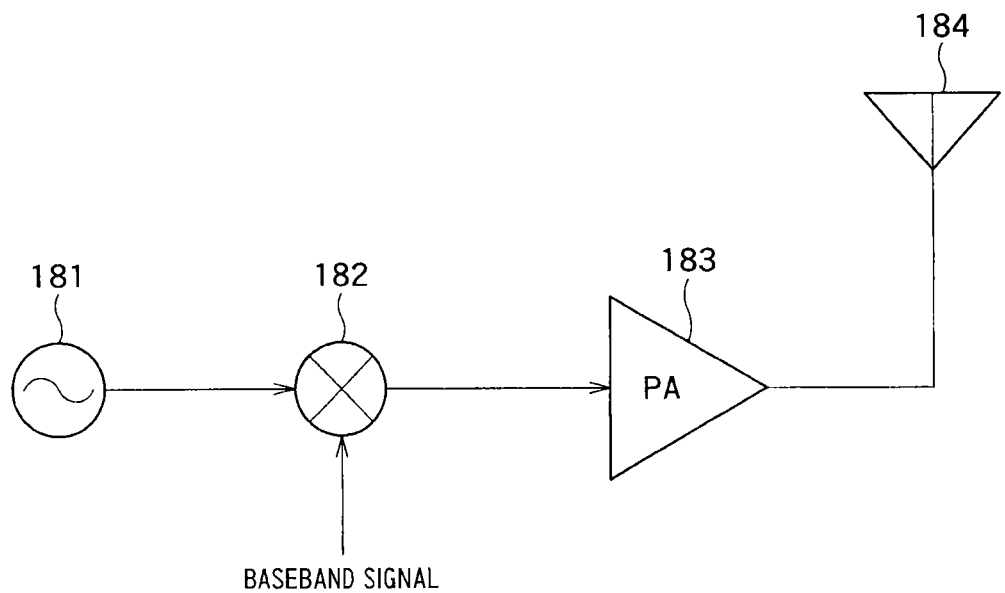
FIG. 16 shows a transmitter according to a tenth embodiment.

FIG. 16 is a block diagram of a transmitter according to a tenth embodiment of the present invention.

A local signal generator 181 generates a local signal of fixed frequency.

A mixer 182 generates a radio frequency signal (a modulation signal) by converting a frequency of a baseband signal including transmission information based on the local signal.

A power amplifier 183 amplifies the radio frequency signal with high power efficiency and high linearity. The power amplifier 183 is a power amplifier according to any one of the first to ninth embodiments.

An antenna 184 outputs the signal amplified by the power amplifier 183 to a space as radio wave.

Eleventh Embodiment

Figure 17:
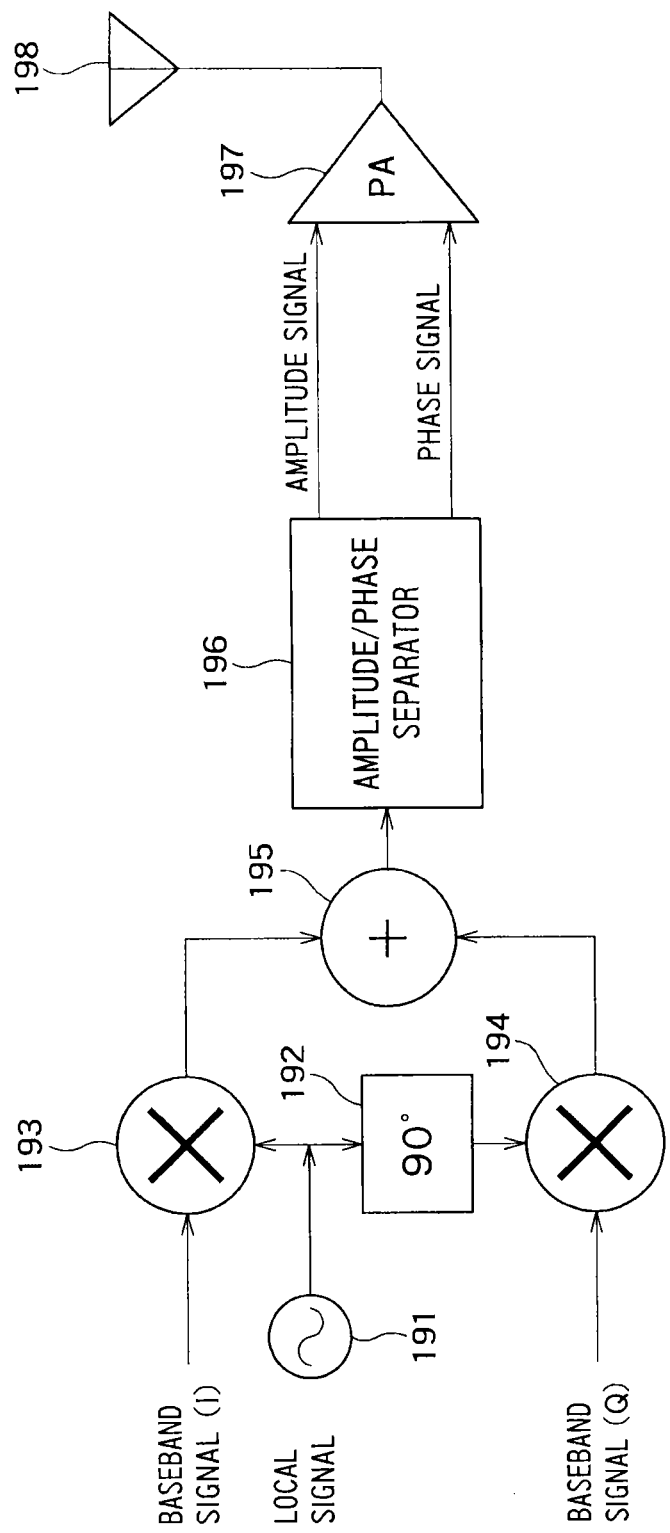
FIG. 17 shows a transmitter according to an eleventh embodiment.

FIG. 17 is a block diagram of a transmitter according to an eleventh embodiment of the present invention.

A local signal generator 191 generates a local signal (a first local signal) of fixed frequency, and inputs the local signal to a mixer 193 together with an in-phase component of a baseband signal. Meanwhile, a phase of the local signal is shifted by 90° in a phase shifter 192. The local signal obtained by shifting the phase by 90° (a second local signal) is input to a mixer 194 together with an orthogonal component of the baseband signal. First and second radio frequency signals as outputs of the mixers 193 and 194 are synthesized in an adder 195. An amplitude component and a phase component of the synthesized signal are separated by an amplitude/phase separator 196. A power amplifier 197 amplifies an input signal with high power efficiency and high linearity according to input amplitude signal and phase signal. The power amplifier 197 is a power amplifier according to any one of the first to ninth embodiments. An antenna 198 outputs the signal amplified by the power amplifier 197 to a space as radio wave.

Although the example of using the MOS transistor has been described in the aforementioned respective embodiments, various transistors may be used instead of the MOS transistor. For example, a bipolar transistor may be used. In this case, connection positions of a gate, a source, and a drain of the MOS transistor may be respectively replaced by connection positions of a base, an emitter, and a collector of the bipolar transistor. That is, the gate of the MOS transistor corresponds to the base of the bipolar transistor. The source of the MOSFET corresponds to the emitter of the bipolar transistor. The drain of the MOSFET corresponds to the collector of the bipolar transistor. Connection positions of other transistors may be similarly made corresponding to those of the MOS transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A power amplifier comprising:
at least two amplifier units including a first amplifier unit and a second amplifier unit, each including a power supply terminal, a ground terminal, an input terminal, and an output terminal, and amplifying a signal received at the input terminal according to a voltage between the power supply terminal and the ground terminal, and outputting the signal from the output terminal;
a first switching element connected between the ground terminal of the first amplifier unit and the power supply terminal of the second amplifier unit;
a second switching element connected between the ground terminal of the first amplifier unit and a first reference voltage terminal; and
a third switching element connected between the power supply terminal of the second amplifier unit and a second reference voltage terminal.

2. The power amplifier according to claim 1, further comprising
a fourth switching element connected in series with the first switching element between the first switching element and the power supply terminal of the second amplifier unit.

3. The power amplifier according to claim 2, further comprising
a voltage holding circuit to hold a voltage of a connection node between the first and fourth switching elements at a constant voltage.

4. The power amplifier according to claim 1, further comprising
a control section to control the first, second, and third switching elements according to a signal originating from external.

5. The power amplifier according to claim 4, further comprising
a boosting circuit,
wherein at least one of the first, second, and third switching elements is an NMOS transistor,
the control section generates a control voltage for the NMOS transistor at a plurality of amplitudes, and
the boosting circuit increases the control voltage having an amplitude equal to or higher than a predetermined value, and applies the control voltage to a gate electrode of the NMOS transistor.

6. The power amplifier according to claim 4,
wherein the signal originating from the external is an envelope signal of an input signal, and
the signal applied to the input terminal of each of the amplifier units is a signal including a phase component of the input signal.

7. The power amplifier according to claim 1, further comprising:
a power dividing unit to divide an input signal into a plurality of signals including at least first and second signals; and
a first level shifter to convert a DC level of the first signal,
wherein the input terminal of the first amplifier unit receives the signal converted by the first level shifter.

8. The power amplifier according to claim 1, further comprising:
an envelope detecting circuit to detect an envelope of an input signal;
a comparing circuit to compare an amplitude of the envelope with a reference voltage; and
a control circuit to turn ON the first switching element, and turn OFF the second and third switching elements when the amplitude of the envelope is lower than the reference voltage, and to turn OFF the first switching element, and turn ON the second and third switching elements when the amplitude of the envelope is equal to or higher than the reference voltage.

9. The power amplifier according to claim 1, further comprising:
a first bias voltage generating circuit to generate a bias voltage between a first output terminal and a second output terminal;
a first buffering capacitor; and
a smoothing capacitor,
wherein a first mode and a second mode are alternately executed, the first mode in which one end and another end of the first buffering capacitor are connected to the first output terminal and the second output terminal, and the second mode in which the one end and the another end of the first buffering capacitor are connected to one end and another end of the smoothing capacitor, and
the one end and the another end of the smoothing capacitor are electrically connected to a bias terminal and the ground terminal of the first amplifier unit.

10. The power amplifier according to claim 1, further comprising:
a first bias voltage generating circuit to generate a bias voltage between a first output terminal and a second output terminal;
first and second buffering capacitors; and
a smoothing capacitor,
wherein a first mode and a second mode are alternately executed, the first mode in which one end and another end of the first buffering capacitor are connected to the first output terminal and the second output terminal, and the second mode in which one end and another end of the second buffering capacitor are connected to the first output terminal and the second output terminal,
the one end and the another end of the second buffering capacitor are connected to one end and another end of the smoothing capacitor when the first mode is executed, and the one end and the another end of the first buffering capacitor are connected to the one end and the another end of the smoothing capacitor when the second mode is executed, and the one end and the another end of the smoothing capacitor are electrically connected to a bias terminal and the ground terminal of the first amplifier unit.

11. The power amplifier according to claim 1, further comprising:
a fourth switching element connected in series with the first switching element between the first switching element and the power supply terminal of the second amplifier unit;
first and second bias voltage generating circuits each to generate a bias voltage between a first output terminal and a second output terminal;
first and second buffering capacitors; and
a smoothing capacitor,
wherein one end of the first buffering capacitor is connected to the first output terminal of the first bias voltage generating circuit,
another end of the first buffering capacitor is electrically connected to the second output terminal of the first bias voltage generating circuit and a connection node between the first switching element and the fourth switching element,
one end of the second buffering capacitor is connected to the first output terminal of the second bias voltage generating circuit,
another end of the second buffering capacitor is connected to the second output terminal of the second bias voltage generating circuit, the second output terminal being connected to the first reference voltage terminal,
one end of the smoothing capacitor is selectively connected any one of the one end of the first buffering capacitor and the one end of the second buffering capacitor, and
another end of the smoothing capacitor is electrically connected to the ground terminal of the first amplifier unit.

12. The power amplifier according to claim 1, further comprising:
a fourth switching element connected in series with the first switching element between the first switching element and the power supply terminal of the second amplifier unit; and
a differential amplifier to generate an amplified signal according to a differential between a constant voltage and a voltage of a connection node between the first switching element and the fourth switching element,
wherein the amplified signal is applied to a bias terminal of the first amplifier unit.

13. A transmitter comprising:
a local signal generator to generate a local signal;
a mixer to generate a radio frequency signal by converting a frequency of a baseband signal based on the local signal;
a power amplifier according to claim 1 to amplify the radio frequency signal; and
an antenna to output an amplified signal of the radio frequency signal.

14. A transmitter comprising:
a local signal generator to generate a first local signal;
a first mixer to generate a first radio frequency signal by converting a frequency of an in-phase component baseband signal based on the first local signal;
a phase shifter to generate a second local signal out of phase with the first local signal by 90°;
a second mixer to generate a second radio frequency signal by converting a frequency of an orthogonal component baseband signal based on the second local signal;
an adder to obtain a synthesized signal by synthesizing the first and second radio frequency signals;
a separator to separate an amplitude component and a phase component of the synthesized signal;
a power amplifier according to claim 1 to amplify the amplitude component and the phase component; and
an antenna to output an signal having the amplitude component and the phase component amplified by the power amplifier.

* * * * *